United States Patent
Sugiyama

(10) Patent No.: US 10,490,635 B2
(45) Date of Patent: Nov. 26, 2019

(54) SEMICONDUCTOR SUBSTRATE MADE OF SILICON CARBIDE AND METHOD FOR MANUFACTURING SAME

(71) Applicant: DENSO CORPORATION, Kariya, Aichi-pref. (JP)

(72) Inventor: Naohiro Sugiyama, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/075,782

(22) PCT Filed: Jan. 12, 2017

(86) PCT No.: PCT/JP2017/000802
§ 371 (c)(1),
(2) Date: Aug. 6, 2018

(87) PCT Pub. No.: WO2017/149945
PCT Pub. Date: Sep. 8, 2017

(65) Prior Publication Data
US 2019/0035894 A1    Jan. 31, 2019

(30) Foreign Application Priority Data
Mar. 4, 2016   (JP) .................................. 2016-42451

(51) Int. Cl.
*H01L 21/20* (2006.01)
*H01L 29/16* (2006.01)
(Continued)

(52) U.S. Cl.
CPC .......... *H01L 29/1608* (2013.01); *C30B 25/20* (2013.01); *C30B 29/36* (2013.01);
(Continued)

(58) Field of Classification Search
CPC .......... H01L 29/1608; H01L 21/02293; H01L 21/02378; H01L 21/205; H01L 29/8611; C30B 25/20; C30B 29/36
See application file for complete search history.

(56) References Cited

U.S. PATENT DOCUMENTS

2003/0080384 A1* 5/2003 Takahashi ............... C30B 25/02
257/347
2005/0022724 A1   2/2005 Malta et al.
(Continued)

FOREIGN PATENT DOCUMENTS

| JP | S55-003631 A | 1/1980 |
| JP | 2012-051760 A | 3/2012 |
| JP | 2013-014469 A | 1/2013 |

*Primary Examiner* — Tucker J Wright
*Assistant Examiner* — Dmitriy Yemelyanov
(74) *Attorney, Agent, or Firm* — Posz Law Group, PLC

(57) ABSTRACT

In a semiconductor substrate having a silicon carbide substrate and an epitaxial film, a concentration ratio between a hydrogen concentration in the silicon carbide substrate and a hydrogen concentration in the epitaxial film is in a range between 0.2 and 5, preferably in a range between 0.5 and 2. Thus, hydrogen diffusion at a boundary position between the epitaxial film and the SiC substrate is restricted. Further, it is possible to prepare the semiconductor substrate for restricting the reduction of the hydrogen concentration. Thus, it is possible to improve the properties of the SiC semiconductor device using the semiconductor substrate, for example, the bipolar device such as a PN diode.

12 Claims, 1 Drawing Sheet

(51) Int. Cl.
*C30B 25/20* (2006.01)
*C30B 29/36* (2006.01)
*H01L 21/205* (2006.01)
*H01L 21/02* (2006.01)
*H01L 29/861* (2006.01)

(52) U.S. Cl.
CPC .. *H01L 21/02293* (2013.01); *H01L 21/02378* (2013.01); *H01L 21/205* (2013.01); *H01L 29/8611* (2013.01)

(56) References Cited

U.S. PATENT DOCUMENTS

2007/0045631 A1* 3/2007 Endo .................... H01L 21/049
257/77
2007/0240630 A1 10/2007 Leonard et al.

* cited by examiner

SEMICONDUCTOR SUBSTRATE MADE OF SILICON CARBIDE AND METHOD FOR MANUFACTURING SAME

CROSS REFERENCE TO RELATED APPLICATIONS

This application is a U.S. national stage application of International Application No. PCT/JP2017/000802 filed on Jan. 12, 2017 and is based on Japanese Patent Application No. 2016-42451 filed on Mar. 4, 2016, the disclosure of which is incorporated herein by reference.

TECHNICAL FIELD

The present disclosure relates to a semiconductor substrate including a SiC substrate made of silicon carbide (i.e., SiC) on which an epitaxial film made of SiC is arranged, and a manufacturing method of the same.

BACKGROUND

Conventionally, a semiconductor substrate made of SiC includes an epitaxial film which is arranged on the SiC substrate, and is made of SiC. The semiconductor substrate made of SiC is used for, for example, a PN diode and a bipolar transistor as a SiC semiconductor device.

The above semiconductor substrate is formed by growing the epitaxial film on a surface of the SiC substrate by a CVD (i.e., chemical vapor deposition) method with hydrogen as a carrier gas using the SiC substrate, which is prepared by crystal growth of a sublimation method under argon gas atmosphere.

In a case where the crustal growth of the SiC substrate is performed by the sublimation method, when the hydrogen gas is introduced into a growth chamber of the sublimation method so that the nitrogen is prevented from being absorbed into a growing crystal, it is possible to obtain the SiC single crystal with ultrahigh purity (see Patent Literature 1).

PRIOR ART LITERATURES

Patent Literature

Patent Literature 1: Japanese Patent No. 4891767

SUMMARY

The carrier lifetime in the SiC semiconductor device depends on the hydrogen concentration in the crystal. Accordingly, in a case where the epitaxial film made of SiC is arranged on the SiC substrate, when the hydrogen as a carrier gas is used and introduced in case of growing the epitaxial film, the carrier lifetime in the epitaxial film is lengthened.

However, when the epitaxial film is formed on the SiC substrate having the low hydrogen concentration level, as shown in FIG. 3, it is confirmed such that the hydrogen may be diffused from the epitaxial film having the high hydrogen concentration level to the SiC substrate having the low hydrogen concentration level. Accordingly, the hydrogen concentration in the epitaxial film at the boundary between the SiC substrate and the epitaxial film is reduced, so that the carrier lifetime is shortened attributed to the reduction, and the electric resistance becomes large. Thus, the difficulty of reducing the properties of the SiC semiconductor device arises.

As described in the above Patent Literature 1, in a case where the SiC substrate is grown by the sublimation method, when the hydrogen gas is introduced into the growing chamber, the hydrogen may be introduced into the SiC substrate. However, the hydrogen may be diffused from the epitaxial film to the SiC substrate because of the difference of the hydrogen concentration, and therefore, it is difficult to restrict the diffusion of the hydrogen even if the hydrogen is merely introduced into the SiC substrate. Thus, the above difficulty may arise.

It is an object of the present disclosure to provide a semiconductor substrate and a method for manufacturing the same to restrict the diffusion of the hydrogen from the epitaxial film made of SiC to the SiC substrate and to improve the properties of the SiC semiconductor device.

According to one aspect of the present disclosure, a semiconductor substrate includes: a SiC substrate made of SiC single crystal and including hydrogen; and an epitaxial film arranged on the SiC substrate and including the hydrogen. The concentration ratio between the hydrogen concentration in the epitaxial film and the hydrogen concentration in the SiC substrate is in a range between 0.2 and 5.

Thus, in the semiconductor substrate having the SiC substrate and the epitaxial film, the concentration ratio between the hydrogen concentration in the epitaxial film and the hydrogen concentration in the SiC substrate is in a range between 0.2 and 5. Thus, the hydrogen diffusion at the boundary between the epitaxial film and the SiC substrate is restricted. Further, it is possible to prepared the semiconductor substrate for restricting the reduction of the hydrogen concentration in the epitaxial film. Accordingly, it is possible to improve the properties of the SiC semiconductor device using the semiconductor substrate, for example, the bipolar device.

According to another aspect of the present disclosure, a manufacturing method of a semiconductor substrate includes: forming a silicon carbide substrate made of silicon carbide single crystal by forming the silicon carbide single crystal including hydrogen using a gaseous growth method for synthesizing silicon carbide from silicon including gas and carbon including gas with hydrogen gas as a carrier gas; and forming an epitaxial film including hydrogen on the silicon carbide substrate using the hydrogen gas as a carrier gas. In the forming of the silicon carbide substrate and the forming of the epitaxial film, a concentration ratio between a hydrogen concentration in the silicon carbide substrate and a hydrogen concentration in the epitaxial film is in a range between 0.2 and 5.

When the SiC ingot for manufacturing the SiC substrate using the gaseous growth method is formed, the hydrogen concentration is easily increased, compared with the sublimation method. Thus, when the SiC substrate is formed by the gaseous growth method, the hydrogen concentration ratio between the hydrogen concentration in the SiC substrate and the hydrogen concentration in the epitaxial film is easily and preferably set to be in a range between 0.2 and 5.

EMBODIMENTS

Figure 1:
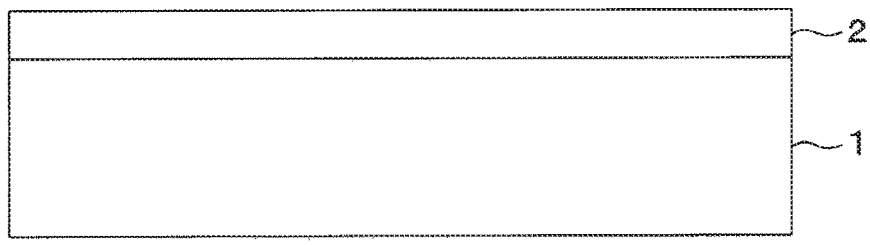
FIG. 1 is a diagram showing a cross sectional view of a semiconductor substrate according to a first embodiment.

Embodiments of the present disclosure will be explained with reference to drawings as follows. Here, explanation will be performed by putting a same reference numeral on the same or equivalent part with each other in the following embodiments.

First Embodiment

A first embodiment will be explained. As shown in FIG. 1, a semiconductor substrate according to the present embodiment is prepared by growing an epitaxial film 2 made of SiC on a SiC substrate 1.

The SiC substrate 1 is made of N conductive type SiC or P conductive type SiC in which the N conductive type impurity such as nitrogen or P conductive type impurity such as aluminum is doped. Further, the hydrogen is doped into the SiC substrate and the hydrogen concentration is, for example, in a range between $2\times10^{18}$ cm$^{-3}$ and $5\times10^{19}$ cm$^{-3}$. The hydrogen concentration may be another concentration. However, it is preferable to set the hydrogen concentration necessary for obtaining the predetermined carrier lifetime in the SiC semiconductor device which is manufactured using the semiconductor substrate. As described above, as long as the hydrogen concentration is set to be at least in a range between $2\times10^{18}$ cm$^{-3}$ and $5\times10^{19}$ cm$^{-3}$, the required carrier lifetime is obtained.

The epitaxial film 2 is a film prepared by the epitaxial growth on the surface of the SiC substrate with the CVD method. The epitaxial film 2 is also made of the N conductive type SiC or P conductive type SiC in which the N conductive type impurity such as nitrogen or P conductive type impurity such as aluminum is doped. Further, the hydrogen is also doped into the epitaxial film 2. The concentration ratio between the hydrogen concentration in the SiC substrate 1 and the hydrogen concentration in the epitaxial film 2 is in a range between 0.2 and 5. Preferably, the ratio is in a range between 0.5 and 2.

The conductive type of the SiC substrate 1 and the conductive type of the epitaxial film 2 may be any type. They are determined in accordance with the SiC semiconductor device. For example, when the PN diode is formed as the SiC semiconductor device, the SiC substrate 1 is made of the N conductive type SiC, and the epitaxial film 2 is made of the p conductive type SIC.

When the hydrogen concentration in the SiC substrate 1 is different from the hydrogen concentration in the epitaxial film 2, it is confirmed such that the diffusion of the hydrogen occurs from the higher hydrogen concentration side to the lower hydrogen concentration side. Specifically, it is confirmed that the diffusion is remarkable when the difference of the hydrogen concentration is equal to or more than one order of magnitude. The range for restricting the diffusion is studied. When the lower hydrogen concentration with respect to the higher hydrogen concentration is ⅕ or more, the effect for restricting the diffusion is obtained. When the lower hydrogen concentration with respect to the higher hydrogen concentration is less than ⅕, the effect for restricting the diffusion is not obtained. As the hydrogen concentration in the SIC substrate 1 is close to the hydrogen concentration in the epitaxial film 2, it is possible to restrict the diffusion of the hydrogen. Preferably, when the lower hydrogen concentration with respect to the higher hydrogen concentration is equal to or more than a half, the effect for restricting the diffusion is higher. Accordingly, as described above, the concentration ratio between the hydrogen concentration in the SiC substrate 1 and the hydrogen concentration in the epitaxial film 2 is in a range between 0.2 and 5. Preferably, the hydrogen concentration is in a range between 0.5 and 2.

The semiconductor substrate having the above feature is used for manufacturing the SiC semiconductor device. For example, a bipolar element such as a PN diode is manufactured as the SiC semiconductor device.

In the above PN diode, since the concentration ratio between the hydrogen concentration in the SiC substrate 1 and the hydrogen concentration in the epitaxial film 2 is in the above described range, the diffusion of the hydrogen into the epitaxial film 2 is restricted. Accordingly, the carrier lifetime is restricted from being shortened, and therefore, the electric resistance is restricted from increasing. Accordingly, the degradation of the properties of the SiC semiconductor device is restricted. Similar effects may be expected in a bipolar transistor such as an IGBT (i.e., Insulated Gate Bipolar Transistor).

Next, a manufacturing method of the semiconductor substrate having the above features will be explained.

First, the SiC substrate 1 is formed. Specifically, a SiC ingot for forming the SiC substrate 1 by a gaseous growth method is prepared. The SiC substrate 1 is formed by cutting the SiC ingot into slices.

For example, not shown in drawings, a SiC single crystal substrate as a seed crystal is arranged on a base. A mixed gas of a gas including silicon such as silane (i.e., SiH$_4$) gas and a gas including carbon such as propane (C$_3$H$_8$) gas is supplied as a SiC raw material gas. The growing space in which the gaseous growth is performed is heated in a range between 2300° C. and 2500° C. Thus, the SiC ingot made of SiC single crystal is formed on the surface of the SiC single crystal substrate.

Then, the gas including silicon and the gas including carbon are introduced as the carrier gas when the SiC ingot is grown. Thus, the hydrogen is doped into the SiC ingot. The dope amount of the hydrogen is determined by a partial pressure of hydrogen in the gas atmosphere supplied to the SiC single crystal substrate. The partial pressure of hydrogen is decided by the amount of hydrogen gas introduced as the carrier gas. In the present embodiment, when the hydrogen element is included in the Si including gas and the carbon including gas, the partial pressure is determined based on a total amount of hydrogen included in these gases and the hydrogen introduced as the carrier gas. Accordingly, the hydrogen amount introduced as the carrier gas is controlled, and the hydrogen concentration doped in the epitaxial film 2 preferable for controlling the lifetime is considered, so that the concentration ratio between the hydrogen concentration in the SiC substrate 1 and the hydrogen concentration in the epitaxial film 2 is controlled in the above described range.

For example, when the SiC ingot is manufactured by the gaseous growth method, and the ratio between silicon and the hydrogen is about 1:10, the hydrogen concentration in the SiC ingot is controlled so as to set the concentration ratio between the hydrogen concentration in the SiC substrate 1 and the hydrogen concentration in the epitaxial film 2 to be in the above range. Experimentally, when the hydrogen introducing amount is adjusted using the above ratio, the hydrogen concentration in the SiC substrate 1 becomes $1\times10^{19}$ cm$^{-3}$. Accordingly, when the silane gas or the propane gas is used as the Si including gas and the C including gas for providing the SiC raw material gas, the hydrogen introduction amount is determined by setting the sum of the hydrogen introduction amount of the carrier gas and the amount of the hydrogen element included in the SiC raw material gas to be the amount corresponding to the above described ratio.

Thus, the SiC ingot obtained by the above method is cut into slices, so that the SiC substrate 1 is manufactured. Then, the SiC substrate 1 is arranged in a chemical vapor deposition (i.e., CVD (i.e., chemical vapor deposition)) device which is not shown in the drawings. Using the CVD apparatus, the epitaxial film 2 is grown on one surface of the SiC substrate 1 by the CVD method. In the CVD method, the hydrogen is used as the carrier gas so that the hydrogen is doped into the growing epitaxial film 2. Specifically, using the hydrogen gas as the carrier gas, for example, the Si including gas such as silane and the C including gas such as propane are introduced into the CVD apparatus. Thus, the epitaxial film 2 is deposited at temperature in a range between 1500° C. and 1600° C.

At that time, the introducing amount of the hydrogen gas introduced as the carrier gas is controlled, so that the partial pressure of hydrogen in the gas atmosphere is adjusted so as to control the hydrogen concentration in the epitaxial film 2 to be in the above described range. Thus, the concentration ratio between the hydrogen concentration in the SiC substrate 1 and the hydrogen concentration in the epitaxial film 2 is in a range between 0.2 and 5. Preferably, the concentration ratio is in a range between 0.5 and 2. Thus, the hydrogen concentration in the epitaxial film 2 is controlled, so that the diffusion of hydrogen from the SiC substrate 1 to the epitaxial film 2 or the diffusion of hydrogen in the opposite direction is restricted.

Experimentally, when the SiC substrate 1 is manufactured by the gas growth method with the hydrogen concentration at $1\times10^{19}$ cm$^{-3}$, and the epitaxial film 2 is formed with the hydrogen concentration in the epitaxial film 2 at $1\times10^{19}$ cm$^{-3}$, the hydrogen concentration distribution is studied. Further, as a comparison, when the SiC substrate 1 is manufactured by the sublimation method, and the epitaxial film 2 is formed on the SiC substrate, the hydrogen concentration distribution is also studied. The sublimation method is a technique such that the SiC raw material is arranged in a crucible made of graphite, and the SiC single crystal substrate is arranged on a base. The SiC raw material gas sublimated at temperature in a range between 2200° C. and 2400° C. is supplied to the SiC single crystal substrate, temperature of which is lower by a few tens Celsius to a few hundreds Celsius than the SiC raw material gas, so that the SiC single crystal ingot is grown. In the sublimation method, the SiC raw material is heated and sublimated in an argon (i.e., Ar) atmosphere. Thus, the hydrogen is little doped into the SiC single crystal ingot. When the ingot is manufactured by the sublimation method, the hydrogen concentration in the SiC substrate 1 is less than $1\times10^{18}$ cm$^{-3}$. Thus, the hydrogen concentration is lower, by an order of magnitude or greater, than the hydrogen concentration in the epitaxial film 2, in which the hydrogen is doped in order to control the lifetime.

The above experiments are performed, and the hydrogen concentration distribution in the SiC substrate 1 and the epitaxial film 2 is measured by the SIMS (i.e., Secondary Ion Mass Spectrometry). The results are shown in FIG. 2.

As shown in the drawing, when the SiC substrate 1 having the lower hydrogen concentration is manufactured by the sublimation method, the hydrogen concentration at the boundary between the SiC substrate 1 and the epitaxial film 2 is gradually changed. Thus, it is considered that the hydrogen in the epitaxial film 2 is diffused into the SiC substrate 1. Thus, when the hydrogen concentration in the epitaxial film 2 is reduced, the carrier lifetime is shortened, and the electric resistance increases. Thus, the degradation of properties of the SiC semiconductor device occurs.

On the other hand, when the hydrogen concentration in the SiC substrate 1 becomes closer to the hydrogen concentration in the epitaxial film 2 using the gas growth method, the hydrogen concentration in the SiC substrate 1 and the hydrogen concentration in the epitaxial film 2 are not changed. Thus, the diffusion of hydrogen from the SiC substrate 1 to the epitaxial film 2 or the diffusion in the opposite direction is restricted. Thus, the carrier lifetime is restricted from shortening, and the electric resistance is restricted from increasing. Thus, the degradation of the properties of the SiC semiconductor device is restricted.

Figure 2:
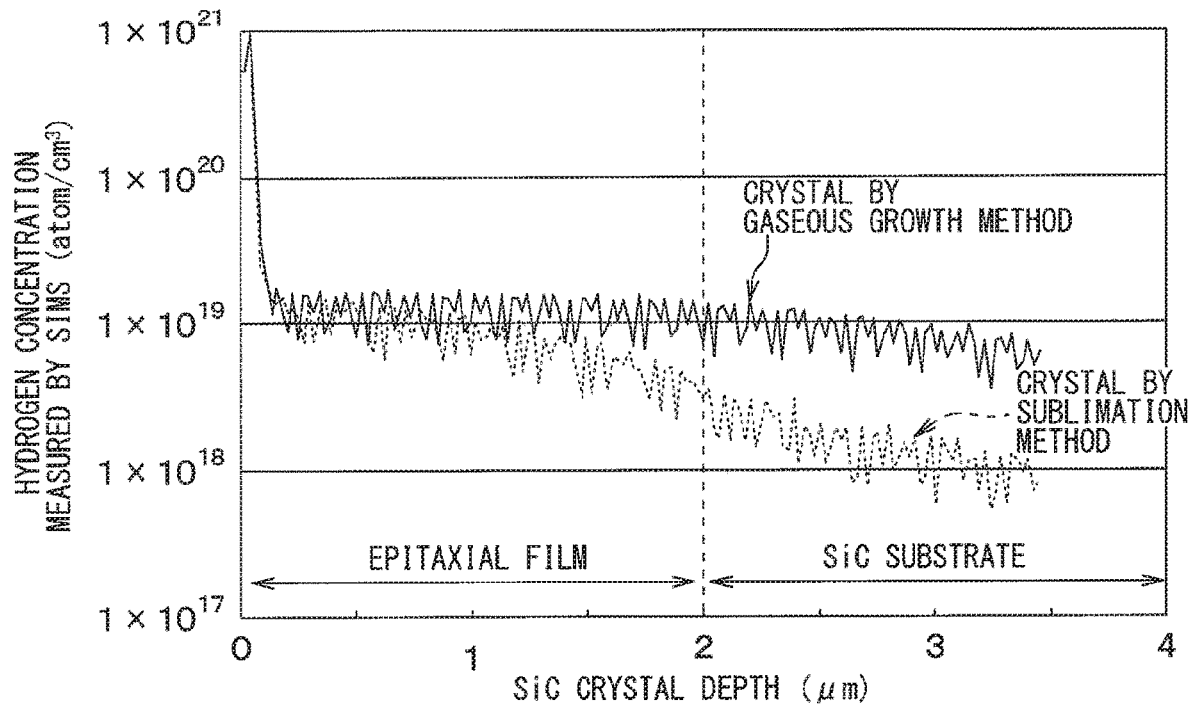
FIG. 2 is a diagram showing an experimental result of a hydrogen concentration distribution in a SiC substrate and an epitaxial film using a SIMS (i.e., Secondary Ion Mass Spectrometry) measurement.
Figure 3:
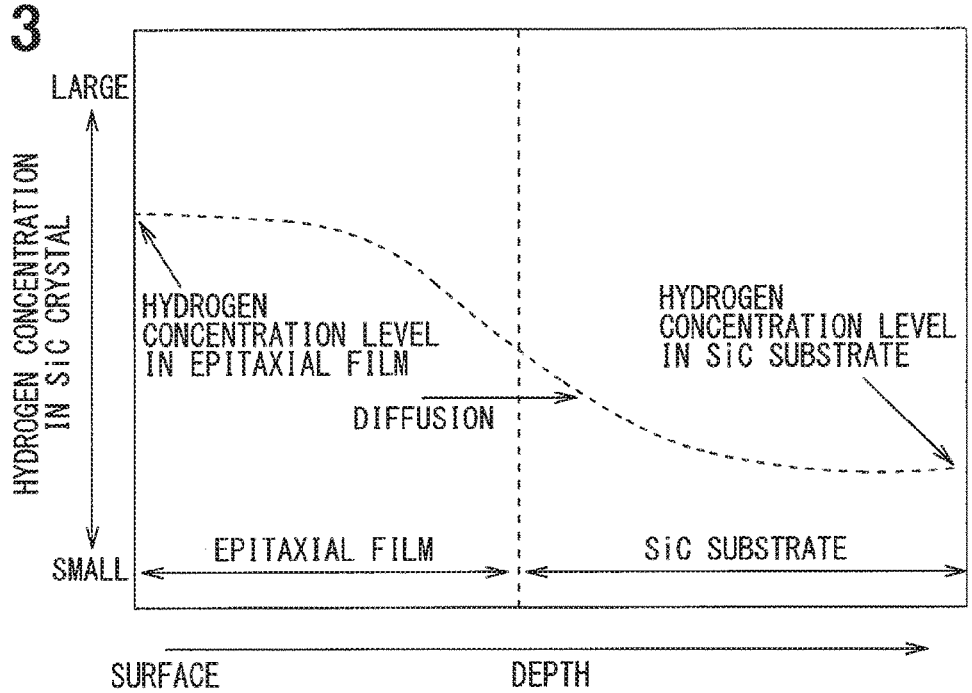
FIG. 3 is a diagram showing an experimental result of the diffusion of the hydrogen when the epitaxial film is formed on the SiC substrate.

Using the semiconductor substrates manufactured in the experiments shown in FIG. 2, i.e., the semiconductor substrate having the concentration ratio between the hydrogen concentration in the SiC substrate 1 and the hydrogen concentration in the epitaxial film 2 in a range between 0.2 and 5 and the semiconductor substrate having the hydrogen concentration in the SiC substrate 1 lower than $\frac{1}{10}$ of the hydrogen concentration in the epitaxial film 2, the PN diode is formed.

As a result, the PN diode formed in the latter semiconductor substrate has the large electric resistance. The carrier lifetime depends on the hydrogen concentration in the epitaxial film 2. Since the hydrogen concentration in the epitaxial film 2 on a boundary side with the SiC substrate 1 is low, the carrier lifetime is shortened.

On the other hand, the PN diode formed in the former semiconductor substrate has the electric resistance smaller than the N diode formed in the latter semiconductor substrate. This is considered that the shortening of the carrier lifetime is restricted since the hydrogen concentration in the epitaxial film 2 is not reduced.

As described above, in the semiconductor substrate having the SiC substrate 1 and the epitaxial film 2, the concentration ratio between the hydrogen concentration in the SiC substrate 1 and the hydrogen concentration in the epitaxial film 2 is in arrange between 0.2 and 5. Preferably, the ratio is in a range between 0.5 and 2. Thus, the diffusion of hydrogen at the boundary position between the epitaxial film 2 and the SiC substrate 1 is restricted. Thus, it is possible to prepare the semiconductor substrate which restricts the reduction of the hydrogen concentration. Accordingly, it is possible to improve the properties of the SiC semiconductor device using the semiconductor substrate, for example, the bipolar device such as the PN diode.

Accordingly, the manufacturing method of the semiconductor substrate may be any method. As described above, when the SiC ingot for manufacturing the SiC substrate 1 using the gaseous growth method is formed, the hydrogen concentration is easily increased, compared with the sublimation method. Thus, when the SiC substrate 1 is formed by the gaseous growth method, the hydrogen concentration ratio between the SiC substrate 1 and the epitaxial film 2 is easily and preferably set to be in the above described range.

Other Embodiments

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

In the above first embodiment, the SiC substrate 1 is manufactured by the gaseous growth method for easily increasing the hydrogen concentration. The SiC substrate 1 may be manufactured by alternative method as long as the SiC substrate having a required hydrogen concentration is formed.

For example, in the sublimation method, when the hydrogen is introduced during a step of growing the crystal, the SiC substrate 1 having the hydrogen concentration equal to or higher than $5 \times 10^{16}$ cm$^{-3}$ is manufactured. Using the SiC substrate 1 manufactured by this method, when the concentration ratio between the hydrogen concentration in the SiC substrate 1 and the hydrogen concentration in the epitaxial film 2 is in a range between 0.2 and 5, preferably in a range between 0.5 and 2, similar effects as the first embodiment are obtained. In this case, when the material including the nitrogen as the N conductive type dopant and/or the aluminum as the P conductive type dopant are introduced into the SiC substrate 1, the SiC substrate 1 has the required conductive type.

The invention claimed is:

1. A semiconductor substrate comprising:
   a silicon carbide substrate made of silicon carbide single crystal and including hydrogen; and
   an epitaxial film arranged on the silicon carbide substrate and including hydrogen, wherein:
   a concentration ratio between a hydrogen concentration in the silicon carbide substrate and a hydrogen concentration in the epitaxial film is in a range between 0.2 and 5, and
   the hydrogen concentration in the silicon carbide substrate is in a range between $2 \times 10^{18}$ cm$^{-3}$ and $5 \times 10^{19}$ cm$^{-3}$.

2. The semiconductor substrate according to claim 1, wherein:
   the concentration ratio between the hydrogen concentration in the silicon carbide substrate and the hydrogen concentration in the epitaxial film is in a range between 0.5 and 2.

3. The semiconductor substrate according to claim 1, wherein:
   the hydrogen concentration in the range between $2 \times 10^{18}$ cm$^{-3}$ and $5 \times 10^{19}$ cm$^{-3}$ occurs at a depth of the semiconductor substrate that is at least 2 μm.

4. The semiconductor substrate according to claim 1, wherein:
   the hydrogen concentration in the range between $2 \times 10^{18}$ cm$^{-3}$ and $5 \times 10^{19}$ cm$^{-3}$ occurs at a depth of the semiconductor substrate that is at least 2.5 μm.

5. The semiconductor substrate according to claim 1, wherein:
   the hydrogen concentration in the range between $2 \times 10^{18}$ cm$^3$ and $5 \times 10^{19}$ cm$^{-3}$ occurs at a depth of the semiconductor substrate that is at least 3.0 μm.

6. The semiconductor substrate according to claim 1, wherein:
   the hydrogen concentration in the range between $2 \times 10^{18}$ cm$^3$ and $5 \times 10^{19}$ cm$^{-3}$ occurs at a depth of the semiconductor substrate between 2 μm and 3.5 μm.

7. A method of manufacturing a semiconductor substrate comprising:
   forming a silicon carbide substrate made of silicon carbide single crystal by forming the silicon carbide single crystal including hydrogen using a gaseous growth method for synthesizing silicon carbide from silicon including gas and carbon including gas with hydrogen gas as a carrier gas; and
   forming an epitaxial film including hydrogen on the silicon carbide substrate using the hydrogen gas as a carrier gas, wherein:
   in the forming of the silicon carbide substrate and the forming of the epitaxial film, a concentration ratio between a hydrogen concentration in the silicon carbide substrate and a hydrogen concentration in the epitaxial film is in a range between 0.2 and 5, and
   in the forming of the silicon carbide substrate, the hydrogen concentration in the silicon carbide substrate is in a range between $2 \times 10^{18}$ cm$^{-3}$ and $5 \times 10^{19}$ cm$^{-3}$.

8. The method of manufacturing the semiconductor substrate according to claim 7, wherein:
   in the forming of the silicon carbide substrate and the forming of the epitaxial film, a concentration ratio between a hydrogen concentration in the silicon carbide substrate and a hydrogen concentration in the epitaxial film is in a range between 0.5 and 2.

9. The method of manufacturing the semiconductor substrate according to claim 7, wherein
   the hydrogen concentration in the range between $2 \times 10^{18}$ cm$^3$ and $5 \times 10^{19}$ cm$^{-3}$ occurs at a depth of the semiconductor substrate that is at least 2 μm.

10. The method of manufacturing the semiconductor substrate according to claim 7, wherein
    the hydrogen concentration in the range between $2 \times 10^{18}$ cm$^3$ and $5 \times 10^{19}$ cm$^{-3}$ occurs at a depth of the semiconductor substrate that is at least 2.5 μm.

11. The method of manufacturing the semiconductor substrate according to claim 7, wherein
    the hydrogen concentration in the range between $2 \times 10^{18}$ cm$^3$ and $5 \times 10^{19}$ cm$^{-3}$ occurs at a depth of the semiconductor substrate that is at least 3.0 μm.

12. The method of manufacturing the semiconductor substrate according to claim 7, wherein
    the hydrogen concentration in the range between $2 \times 10^{18}$ cm$^3$ and $5 \times 10^{19}$ cm$^3$ occurs at a depth of the semiconductor substrate between 2 μm and 3.5 μm.

\* \* \* \* \*